United States Patent [19]
Bartz et al.

[11] Patent Number: 5,189,418
[45] Date of Patent: Feb. 23, 1993

[54] DITHER ERROR CORRECTION

[75] Inventors: Manfred U. Bartz, Snohomish; Donald R. Hiller, Lake Stevens, both of Wash.

[73] Assignee: Hewlett-Packard Company, Palo Alto, Calif.

[21] Appl. No.: 872,744

[22] Filed: Apr. 16, 1992

[51] Int. Cl.⁵ ............................................. H03M 1/20
[52] U.S. Cl. .................................. 341/131; 341/118; 341/155
[58] Field of Search ............... 341/131, 118, 155, 156, 341/163, 143

[56] References Cited

U.S. PATENT DOCUMENTS

| | | | |
|---|---|---|---|
| 4,550,309 | 10/1985 | Hiller et al. | 341/131 |
| 4,761,634 | 8/1988 | Yamaguchi et al. | 341/131 |
| 4,814,767 | 3/1989 | Fernandes et al. | 341/158 |
| 4,963,881 | 10/1990 | Franceshini | 341/131 |
| 4,994,803 | 2/1991 | Blackham | 341/131 |
| 5,134,399 | 7/1992 | Hiller | 341/131 |

OTHER PUBLICATIONS

Honig, et al., *Adaptive Filters*, Excerpt from book, Sections 3.1 and 3.2, pp. 48–53, 1985.

*Primary Examiner*—Sharon D. Logan

[57] ABSTRACT

A technique for correcting settling, feedthru, and higher order error mechanisms in a dithered analog-to-digital conversion circuit is disclosed. For each conversion cycle of an ADC, a dither signal is generated by converting a current dither value from a sequence of dither values and is then added to an analog input signal. The analog input signal and dither signal are converted by the ADC, and the current dither value subtracted, to form a digital output signal. Correction signals proportional to dither values which precede or follow the current dither value in the sequence are also generated each conversion cycle and subtracted from the analog input signal. The proportions used to produce the correction signals are adjusted dynamically according to the amount of correlation between the digital output signal and the dither values used to form the correction signals. The correction signals are thereby made to equal the amount of error contributed by a corresponding one of the error mechanisms.

15 Claims, 7 Drawing Sheets

DITHER ERROR CORRECTION

FIELD OF THE INVENTION

The present invention relates to analog-to-digital conversion circuits which employ dithering, and more particularly relates to correcting noise errors introduced by the use of dither.

BACKGROUND AND SUMMARY OF THE INVENTION

Dithering is a well known technique for improving the accuracy and the digital resolution of analog-to-digital conversions. The technique of dithering involves adding a random noise signal [hereinafter dither signal] to an analog input signal before conversion of the analog input signal, and afterwards, subtracting the dither signal from the output of the conversion.

In the typical dithered analog-to-digital conversion circuit, the dither signal is generated with a digital pseudo-random noise (PRN) generator which produces a sequence of random digital values. The random digital values are converted by a digital-to-analog converter (DAC) into analog form and combined with the analog input signal at a summing junction. The combination of the analog input signal and dither signal is converted by an analog to digital converter (ADC) which produces a digital output signal. Finally, the original form of the dither signal (the sequence of random digital values) is subtracted from the digital output signal. Ideally, the digital output signal then corresponds only to the analog input signal. The path followed by the dither signal in the typical dithered analog-to-digital circuit is illustrated in block diagram form by FIG. 2.

A problem with the dithering technique occurs when subtraction of the digital dither signal from the digital output signal fails to completely remove the dither signal from the digital output signal. Any such residue of the dither signal in the digital output signal results in the digital output signal being an inaccurate digital representation of the analog input signal. One reason for the occurrence of dither signal residue is that the dither signal is amplified along the dither signal path. Amplification may occur, for example, during conversion of the dither signal by the DAC or the ADC. When this happens, the dither signal present in the digital output signal before the subtraction will be greater or less than the original, digital dither signal. Since only the digital dither signal is subtracted, a residue of the amplified dither signal remains in the digital output signal. This mismatch in gain between the dither being added in and the dither being subtracted out is known as gain error. This gain error results in increased noise which limits the signal-to-noise dynamic range of the AD circuit.

In a copending application, Ser. No. 07/817,710, filed Jan. 7, 1992, Don Hiller, a co-inventor of the present invention, disclosed a technique for correcting gain error through use of an active gain control loop. A circuit constructed according to the technique is shown in FIG. 1. The technique consists of adjusting the gain of the dither signal path according to the amount of dither signal residue remaining in the digital output signal after subtraction of the dither signal. Dither signal residue is detected by correlating the digital output signal to the digital dither signal. (In a simplified version, it is sufficient to correlate the digital output signal to only the most significant bit of the digital dither signal.) The amount of correlation corresponds to the amount of dither signal residue in the digital output signal. A signal proportional to the amount of correlation is fed back to a component with an adjustable gain in the dither signal path and used to dynamically adjust the gain of the dither signal path. When properly adjusted, there will be no amplification of the dither signal along the dither signal path and no residue caused by gain error.

The technique just described is effective for correcting first order gain drifts. However, dithered analog-to-digital conversion circuits may also suffer from second and higher order error mechanisms contributed by limitations of the circuit's components. Non-ideal characteristics of the components also cause imperfect subtraction of the digital dither signal from the digital output signal, leaving dither signal residue in the digital output signal. Such second order effects can fundamentally limit the theoretically achievable signal-to-noise dynamic range of the dithered analog-to-digital conversion circuit.

Key examples of component limitations which can result in imperfectly subtracted dither include settling speed and signal isolation. A dithered analog-to-digital conversion circuit experiences settling errors because of speed limitations of the circuit's analog components. The PRN generator operates at a fast rate to produce a sequence of random dither values which vary greatly in magnitude from one dither value to the next in the sequence. The analog circuits and components in the dither signal path may be unable to settle to the exact magnitude of the next dither value before the ADC performs an analog-to-digital conversion of its next sample from the summing junction. However, when the exact dither value is subtracted from the digital output signal, residual error introduced by incomplete settling of the analog components remains.

A second source of residual error are those errors caused by imperfect input-to-output signal isolation of components in the dither signal path [hereinafter feedthru errors]. Imperfect input-to-output signal isolation of components results in dither values leaking through with the wrong analog-to-digital conversion sample. Such misplaced dither values will also fail to subtract correctly from the digital output signal. Typically, it is the ADC, specifically a sample and hold circuit inside the ADC, which experiences imperfect input-to-output signal isolation.

The present invention is an improvement over the first order gain control technique. The present invention is directed towards the correction of second order error mechanisms such as settling error and feedthru error. The technique of the present invention also extends to the correction of higher order error mechanisms which correlate to the dither signal.

Second and higher order error mechanisms, such as settling and feedthru errors, are the result of having a remnant of previous or subsequent dither values leaking into the current conversion sample and not being subtracted out. Correction of higher order errors, therefore, can be accomplished by anticipating the amount of error contributed by a previous or subsequent dither value and subtracting it out apriori. Correction of settling errors, for example, can be accomplished by generating a correction signal proportional to the dither value which precedes the current dither value in the PRN sequence and subtracting the correction signal at the summing junction. The settling error correction signal can be generated by, concurrently with conversion of the current dither value by the DAC, converting the preceding dither value into an analog signal with a second DAC and scaling the analog signal by a proportionality constant. Similarly, feedthru errors can be corrected by generating a correction signal proportional to the dither value following the current dither value in the PRN sequence and subtracting the correction signal at the summing junction.

The correct proportionality constant to use in generating a correction signal is dependent on the particular circuit's component limitations. An adequate proportionality constant may be determined by manually presetting the proportionality constant to a fixed value which minimizes the contribution of a particular error mechanism. However, performance characteristics of the circuit components are likely to vary with temperature and time. Such variations may change the amount of residual error caused by a particular error mechanism and require a change in the proportionality constant.

In order to compensate for variations in the performance characteristics, the present invention provides a technique for dynamically setting the proportionality constant. The proportionality constant for each correction signal is dynamically adjusted with an active gain control loop. The amount of residual error contributed by a particular error mechanism is detected with a correlator and accumulator combination. The proportionality constant for the correction signal associated with the error mechanism is then adjusted accordingly to minimize the amount of error detected.

A further feature of the invention is that the error correction circuitry can be fully implemented in digital circuitry. Thus, the invention may be incorporated into a single integrated circuit for use in dithered ADC circuits.

The foregoing and additional features and advantages of the invention will be more readily apparent from the following detailed description, which proceeds with reference to the accompanying drawings.

DETAILED DESCRIPTION

Figure 1:
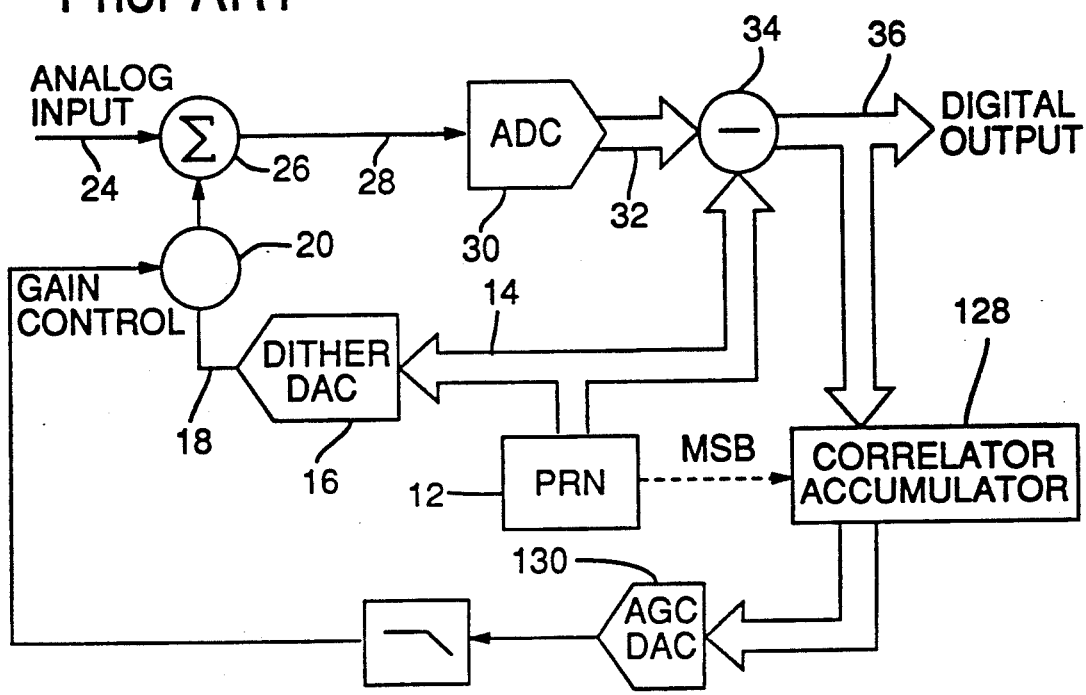
FIG. 1 is a block diagram of a dithered analog-to-digital conversion circuit with an active gain control loop for gain error correction according to the prior art.
Figure 2:
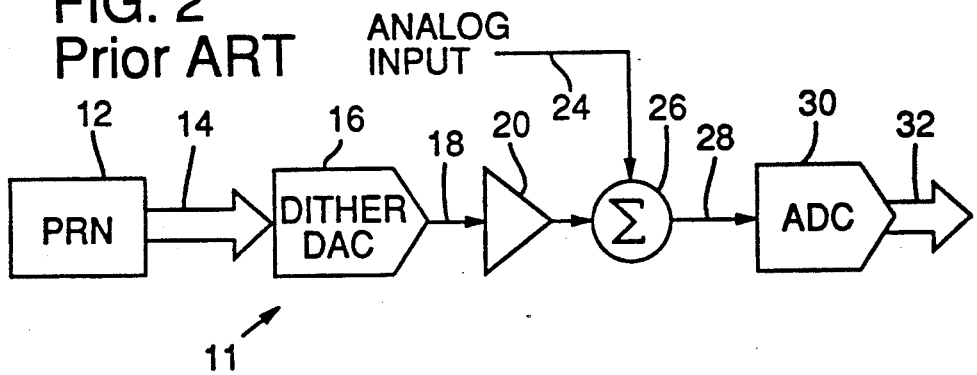
FIG. 2 is a block diagram of a dither signal path in a dithered analog-to-digital conversion circuit according to the prior art.

FIG. 2 shows a dither path 11 in a dithered analog-to-digital conversion (ADC) circuit. The dither path 11 is similar to the path travelled by a dither signal in the prior art, dithered ADC circuit in FIG. 1. A pseudo-random noise (PRN) generator 12 produces a sequence of random dither values 14. A dither DAC 16 sequentially converts the dither values into an analog dither signal 18. A gain control amplifier 20 forms part of an active gain control loop shown in FIG. 1 which compensates for gain error of the dither path 11 according to the technique disclosed in co-pending application, Ser. No. 07/817,710, by Donald Hiller. The analog dither signal 18 is summed with an analog input signal 24 at summing junction 26. The combined signal 28 from the summing junction 26 is converted by an analog-to-digital converter (ADC) 30 to digital form, producing a digital combined signal 32. In the complete dithered ADC circuit (FIG. 1), the dither values 14 are subtracted from the digital combined signal 32 with a subtractor 34 to produce a digital output signal 36 which corresponds to the analog input signal 24.

Settling error can occur in the dither path 11 as a result of speed limitations of the DAC 16, the amplifier 20, the summing junction 26, and the ADC 30 which prevent the combined signal 28 from fully settling before the ADC 30 performs a conversion. The dither values in the sequence 14 are generated at a rapid rate and vary greatly in magnitude. Each new dither value, after being converted to analog form by the dither DAC 16, must propagate through the analog circuit components and reach the ADC 30 before the next conversion of the ADC 30. Otherwise, the digital combined signal 32 will not have a magnitude equal to the sum of the analog input signal 24 and the current digital dither value from the sequence 14. In which case, a subsequent subtraction of the current digital dither value from the digital output signal (See FIG. 1) will not yield a digital output signal 36 that accurately represents the analog input signal 24.

The analog dither signal 18, then, makes transitions in magnitude from a magnitude equal to the previous digital dither value in the sequence 14 to one equal to the current digital dither value. Due to speed limitations of the analog components, the analog dither signal 18 may only partially complete this transition before the ADC 30 conversion takes place. The amount of the settling error caused by the speed limitations is, therefore, equal to the difference between the actual magnitude of the analog dither signal 18 at the time of the ADC 30 conversion and the magnitude of the analog dither signal 18 had the transition been completed. That difference is proportional to the difference between the current digital dither value and the previous digital dither value. Thus, the settling error may be corrected by generating a correction signal correctly proportional to the difference between the previous dither value and the current dither value and by subtracting the correction signal at the summing junction 26.

Figure 3:
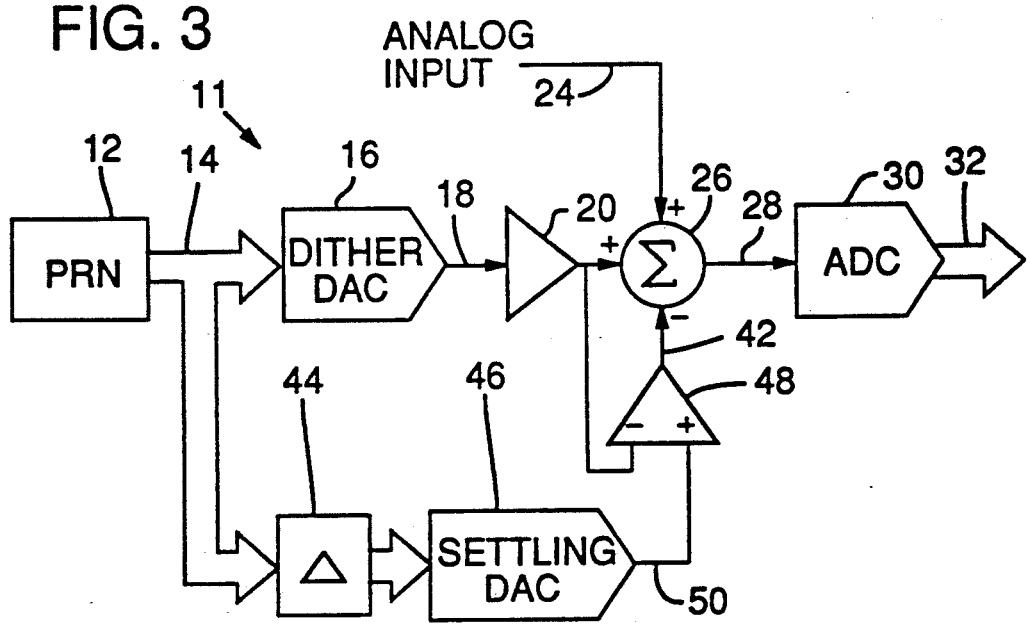
FIG. 3 is a block diagram of a dither signal path in a dithered analog-to-digital conversion circuit including circuitry for settling error correction according to the present invention.

Referring now to FIG. 3, a dither path 11 in a dithered ADC circuit with settling error correction according to a first embodiment of the present invention includes a delay latch 44, a settling DAC 46, and a differential amplifier 48 for generating a settling error correction signal 42. The dither DAC 16 and settling DAC 46 operate in synchronization with the ADC 30 to each convert a dither value for every conversion sample of the combined signal 28 taken by the ADC 30. The delay latch 44 delays the sequence of dither values 14 exactly one sample period of the ADC 30 before the sequence is presented to the settling DAC 46. The settling DAC 46, therefore, is presented with a dither value from the sequence 14 which immediately precedes a dither value presented to the dither DAC 16. In this manner, an analog signal 50 produced by the settling DAC 46 has a magnitude during the current conversion cycle of the ADC 30 equal to the magnitude of the dither signal 18 during the preceding conversion cycle of the ADC 30.

The differential amplifier 48 produces the correction signal 42. The analog signal 50 having a magnitude equal to the previous dither value drives the positive terminal of the differential amplifier 48 and the dither signal 18 with a magnitude equal to the current dither value drives the negative terminal. The correction signal 42, therefore, is generated to be proportional to the difference between the previous dither value and the current dither value. The proportion is selected by presetting the gain of the differential amplifier 48 to a gain that minimizes the settling error.

Figure 4:
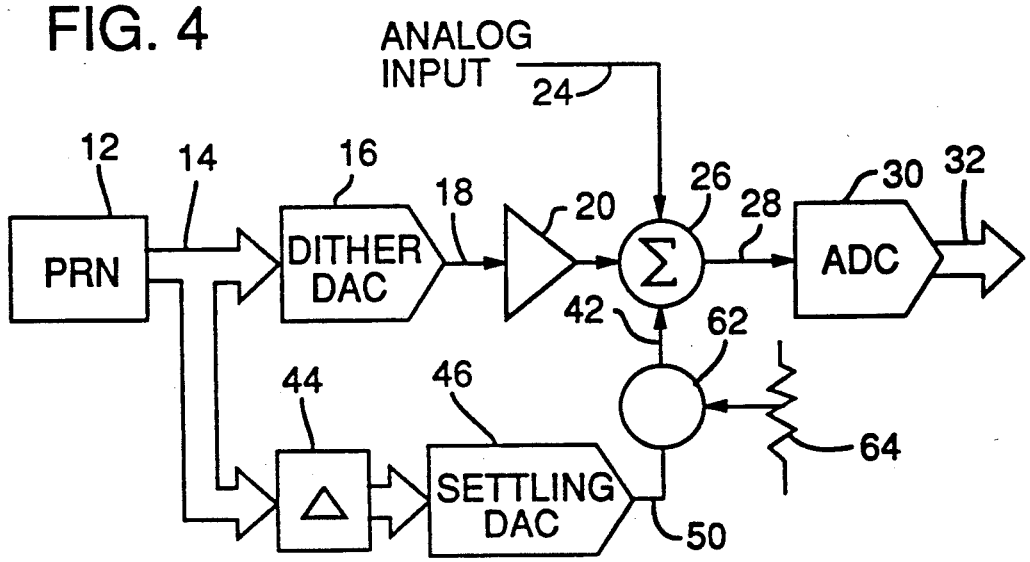
FIG. 4 is a block diagram of a dither signal path in a dithered analog-to-digital conversion circuit including simplified circuitry for settling error correction according to the present invention.

A second embodiment of the present invention shown in FIG. 4 presents a simplified technique for correcting settling error. In the second embodiment, the correction signal 42 is merely proportional to the previous dither value rather than being proportional to the difference between the previous dither value and the current dither value. The differential amplifier 48 of the first embodiment is thereby eliminated in the second embodiment. The analog signal 50 which is proportional to the previous dither value is instead scaled by an amplifier 62 with a fixed gain to form the correction signal 42. The gain of the amplifier 62 is pre-set by manually adjusting a variable resistor 64.

The simplified technique of the second embodiment is mathematically equivalent to the correction technique in the first embodiment. In the first embodiment, FIG. 3, the combined signal 28 is given by the following equation:

$$CS = AI + D - k(S - D) \quad (1)$$

where CS is the combined signal 28, AI is the analog input signal 24, D is the dither signal 18, S is the analog signal 50, and k is the gain of the differential amplifier 48. Using the distributive property, equation (1) can be simplified as follows:

$$CS = AI + (1 + k)D - k * S \quad (2)$$

Equation (2) shows that settling error can be equivalently corrected by both adding a signal proportional to the dither signal 18 (D) and subtracting a signal proportional to the analog signal 50 (S) at the summing junction 26. In the second embodiment, FIG. 4, the amplifier 62 forms a correction signal 42 proportional to the analog signal 50 which is subtracted at the summing junction 26. Adding a signal proportional to the dither signal 18 is accomplished by simply adjusting the gain of amplifier 20 to equal 1+k. It is not necessary to make this adjustment manually because the gain of amplifier 20 is automatically adjusted by an active gain control (AGC) loop as shown in FIG. 1 and described in the co-pending application, Ser. No. 07/817,710. This AGC loop dynamically adjusts the gain of the amplifier 20 to null out residue of the current dither value in the digital output signal 36.

Figure 5:
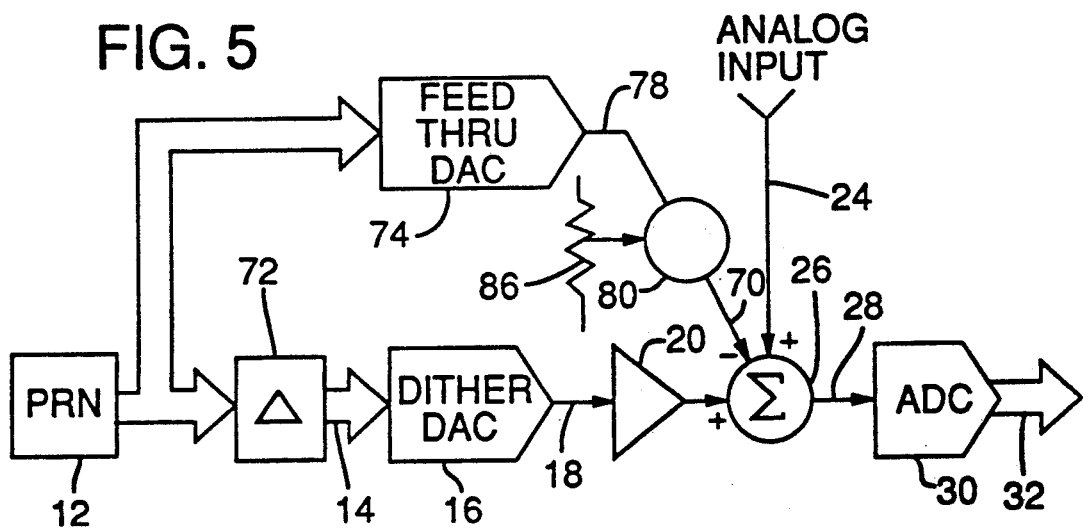
FIG. 5 is a block diagram of a dither signal path in a dithered analog-to-digital conversion circuit including circuitry for digital feedthru error correction according to the present invention.

Referring to FIG. 5, a third embodiment of the invention provides correction of feedthru error. In the case of feedthru error, the residual error present in the digital output signal 36 is related to later dither values which leak into the conversion with the current dither value. The later dither values leak into the current conversion when there is insufficient input to output signal isolation of components. The resulting feedthru error is corrected by generating a correction signal 70 proportional to the dither value which follows the current dither value in the sequence 14. The correction signal 70 is then subtracted at the summing junction 26.

In the third embodiment, a delay latch 72 is connected between the PRN generator 12 and the dither DAC 16. A feedthru DAC 74 is connected directly to the PRN generator 12. In this manner, the current dither value is presented to the dither DAC 16 at the same time that the next dither value in the sequence is presented to the feedthru DAC 74. The feedthru DAC 74 converts the next dither value to an analog signal 78. An amplifier 80 attenuates the analog signal 78 to form a correction signal 70 which is the correct proportion of the next dither value. The proportionality constant is set manually by adjusting a voltage divider 86.

The techniques shown in FIGS. 4 and 5 can be extended to the correction of higher order error mechanisms. Third and higher order error mechanisms are caused by the leakage of dither values from positions in the sequence that precede or follow the current dither value by two or more positions. These errors can also be corrected by generating correction signals proportional to the responsible dither values and subtracting the correction signals at the summing junction 26.

Figure 6:
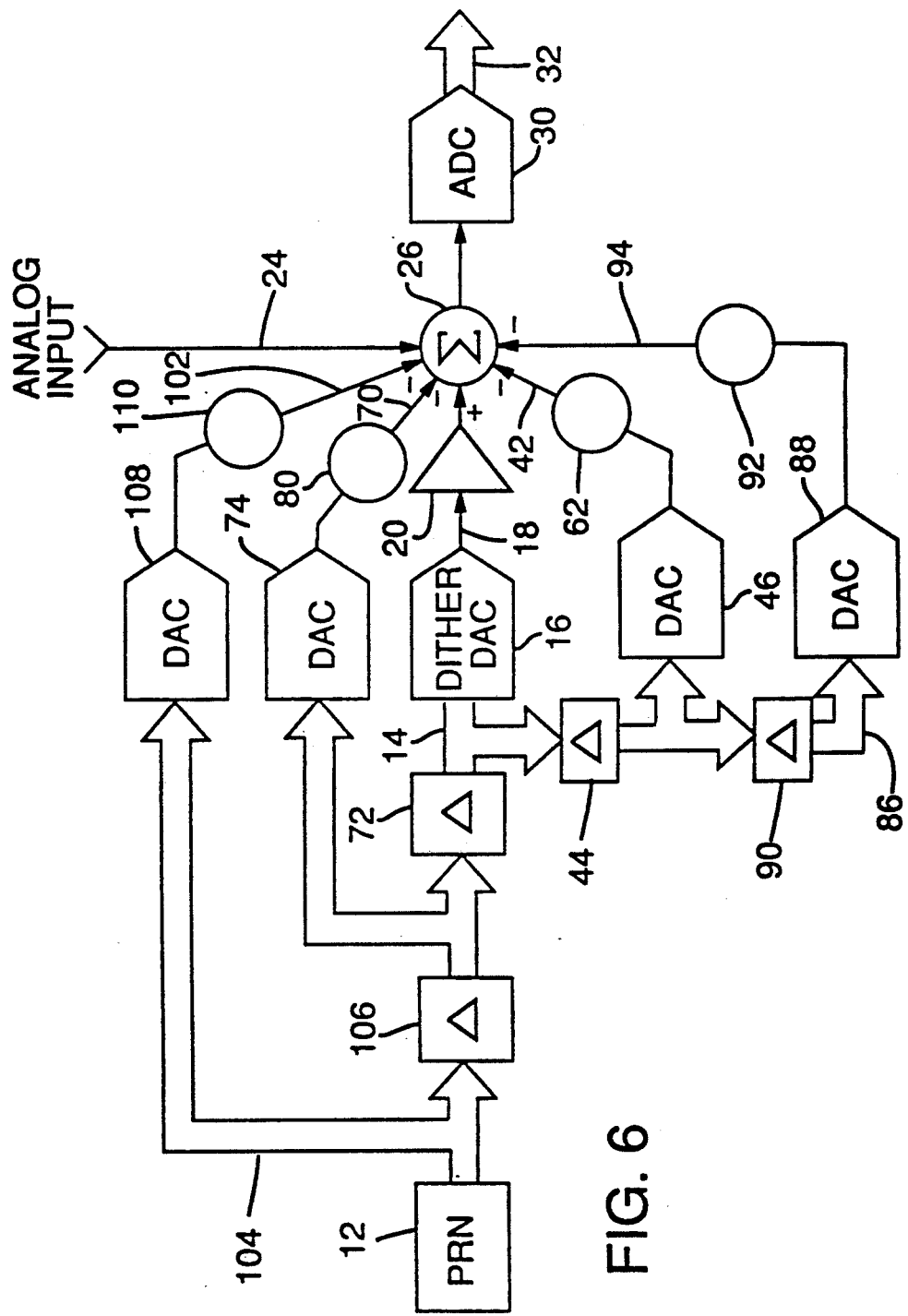
FIG. 6 is a block diagram of a dither signal path in a dithered analog-to-digital conversion circuit including higher order error correction circuitry according to the present invention.

In the fourth embodiment of the invention shown in FIG. 6, both a correction signal 42 for correction of settling error and a correction signal 70 for correction of feedthru error are generated. As in the second embodiment, the correction signal 42 for settling errors is generated by the delay latch 44, the DAC 46, and the amplifier 62. As in the third embodiment, the correction signal 70 for feedthru errors is generated by the delay latch 72, the DAC 74, and the amplifier 80. Higher order errors caused by dither values which precede or follow the current dither value by two positions in the sequence 14 are also corrected. Dither values 86 which precede the current dither value by two positions in the sequence 14 are directed to a DAC 88 by connecting a delay latch 90 to the output of the delay latch 44. The output of the DAC 88 is scaled by an amplifier 92 to form a correction signal 94 proportional to the dither values 86. The correction signal 94 is then subtracted at the summing junction 26. Another correction signal 102 for correcting errors caused by leakage of dither values 104 that follow two positions behind the current dither value is generated by a delay latch 106, a DAC 108, and an amplifier 110. This correction signal 102 is also subtracted at the summing junction 26.

Figure 7:
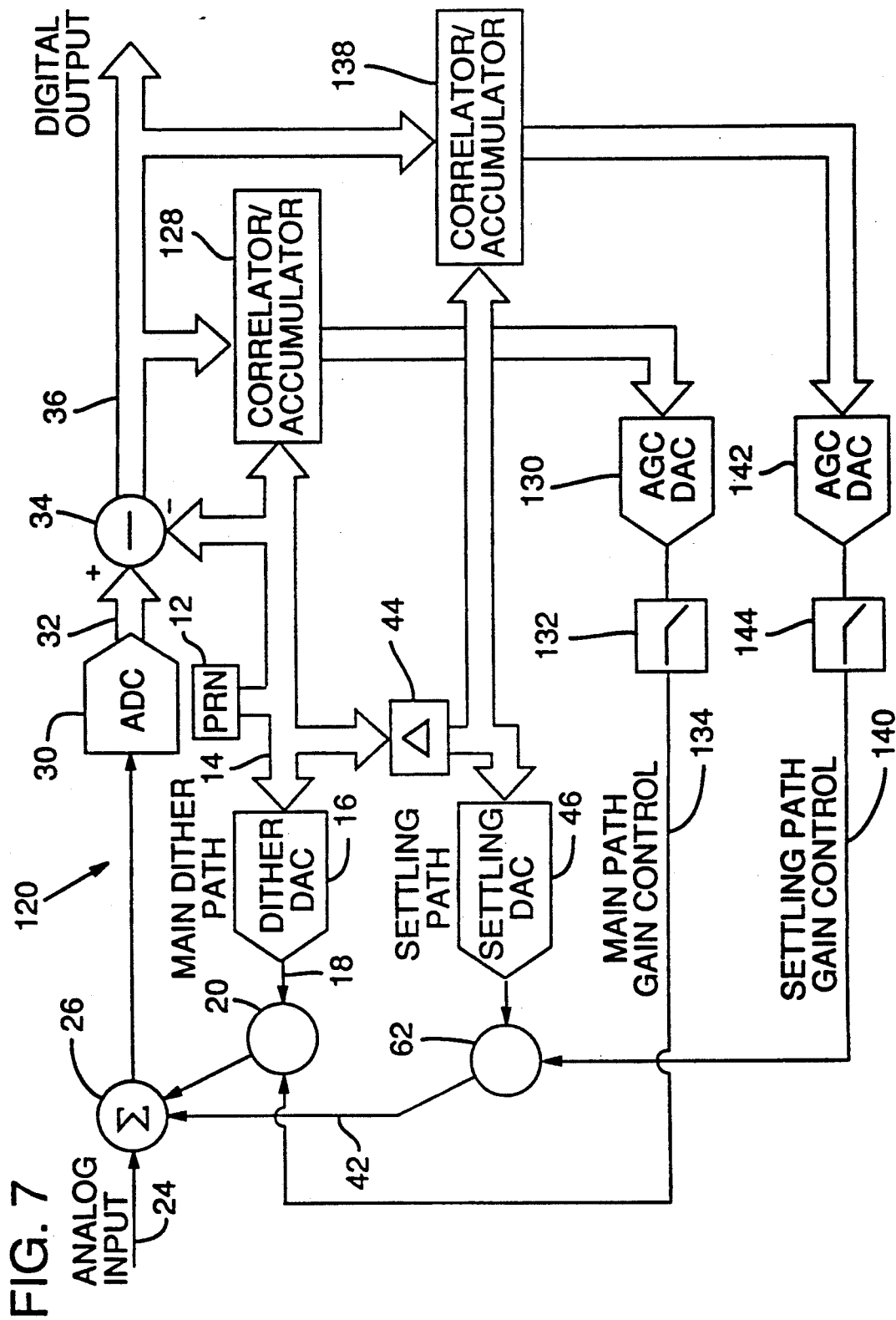
FIG. 7 is a block diagram of a dithered analog-to-digital conversion circuit including circuitry for adaptive settling error correction according to the present invention.

The present invention also includes dynamic adjustment of correction signal gain. The invention depends upon forming a correction signal equal in magnitude to the error contributed by a particular error mechanism, so that subtraction of the correction signal results in removal of the error. The correction signal is formed by generating a signal proportional to dither values associated with a particular error mechanism. In order for the correction signal to be equal in magnitude to the error, the correct proportion of the dither values must be used. In the first through fourth embodiments, the correct proportion is set by manually adjusting the gain of the amplifier with a voltage divider. Unfortunately, due to variations in circuit performance with time and temperature, a fixed proportionality constant may be inadequate. Therefore, the present invention also includes adaptive adjustment of the proportionality constants. An example of adaptive proportionality adjustment is shown in FIG. 7. In this fifth embodiment of the invention, the proportionality constant of correction signal 42 is set by adjusting the gain of the amplifier 62 using an active gain control loop.

FIG. 7 shows a complete dithered ADC circuit 120 according to the fifth embodiment of the invention. The dithered ADC circuit 120 includes a dither path consisting of the PRN generator 12, the dither DAC 16, the amplifier 20, the summing junction 26, and the ADC 30. The PRN generator 12 produces a sequence 14 of dither values which are introduced into the ADC 30 conversion by the DAC 16 and summing junction 26. The dither values are removed from the digital combined signal 32 by subtracting the dither values from the digital combined signal with the digital subtractor 34. The delay latch 44, the settling DAC 46, and amplifier 62 produce the correction signal 42 for correcting settling error.

The gain of the amplifier 20 in the dither path is adjusted by an active gain control loop comprising a correlator/accumulator 128, a DAC 130, and a filter 132. The correlator/accumulator 128 detects the amount of residual error contributed by non-unity gain of the dither path. The correlator/accumulator 128 correlates the digital output signal 36 to the dither values generated by the PRN generator 12 and accumulates the amount of correlation. The DAC 130 generates a feedback dither path gain control signal 134 corresponding to the amount of error. The filter 132 is a low pass filter for removing noise from the dither path gain control signal 134. The dither path gain control signal 134 adjusts the gain of the amplifier 20 to minimize the amount of residual error which correlates to the current dither values.

A similar gain control loop is provided for adjusting the gain of the amplifier 62 to set the correct proportionality constant for the settling error correction signal 42. A second correlator/accumulator 138 receives the same delayed dither values from the delay latch 44 as does the settling DAC 46. The delayed dither values from the delay latch 44 precede the current dither values by one position in the sequence 14 generated by the PRN generator 12. The delayed dither values are correlated against the digital output signal 36 in the correlator/accumulator 138 and the amount of correlation accumulated. In this manner, the amount of residual error in the current digital output contributed by the preceding dither value is detected. The gain of the amplifier 62 is adjusted accordingly to minimize the residual error by generating a feedback settling path gain control signal 140 with a DAC 142 and a low pass filter 144.

Figure 8:
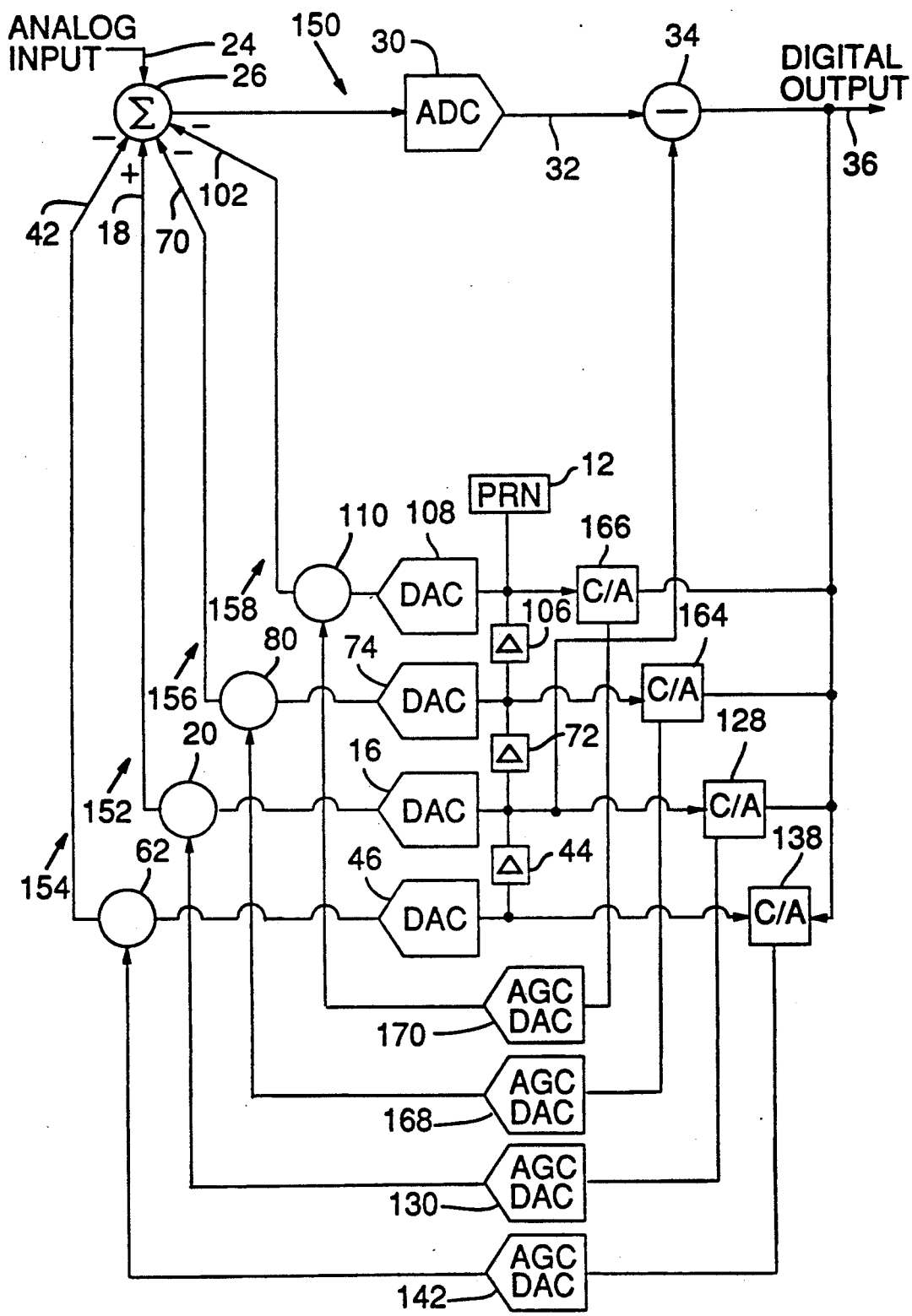
FIG. 8 is a block diagram of a dithered analog-to-digital conversion circuit including circuitry for higher order adaptive settling error and feedthru error correction according to the present invention.

The technique for adaptively adjusting the gain of the settling error correction signal is extendable to provide adaptive gain adjustment of additional dither error correction signals. Referring to FIG. 8, a generalized adaptive dithered ADC circuit 150 according to a sixth embodiment of the invention includes a dither signal path 152, a settling error correction path 154, a feedthru error correction path 156, and a third order error correction path 158. The dither signal path 152 includes the dither DAC 16, the amplifier 20, the summing junction 26, and the ADC 30 as in FIG. 3. As in FIG. 6, the error correction paths 154, 156, and 158 each include a delay latch (the delay latches 44, 72, and 106 respectively), a DAC (the DACs 46, 74, and 108), and an amplifier (the amplifiers 62, 80, and 110) for generating the correction signals 42, 70, and 102 respectively.

Each of the paths 152, 154, 156, and 158 has associated therewith an AGC loop for dynamically correcting the gain of the amplifiers 20, 62, 80, and 110. The gain of the amplifier 20 in the dither signal path 152 is adjusted by correlating the current dither value to the digital output signal 36 with the correlator/accumulator 128 and generating a dither path gain control signal proportional to the detected amount of correlation with a gain control DAC 130. The gain of the amplifier 62 in the settling error correction path 154 is adjusted by correlating the delayed dither values from the delay latch 44 to the digital output signal 36 with the correlator/accumulator 138. The gain control DAC 142 then generates a signal proportional to the amount of correlation detected and adjusts the gain of the amplifier 62 accordingly.

The gain of the feedthru error correction path 156 and the third order error correction path 158 are dynamically corrected in a similar manner. The dither values from the delay latch 106 which drive the feedthru error correction path 156 are correlated against the digital output signal 36 by a correlator/accumulator 164. The dither values from the PRN generator 12 which drive the third order correction path 158 are correlated against the digital output signal 36 by a correlator/accumulator 166. Gain control DACs 168 and 170 generate voltage signals proportional to the amount of correlation detected by correlator/accumulators 164 and 166 respectively. The signals generated by DACs 168 and 170 adjust the gain of the amplifiers 80 and 110 respectively.

Figure 9:
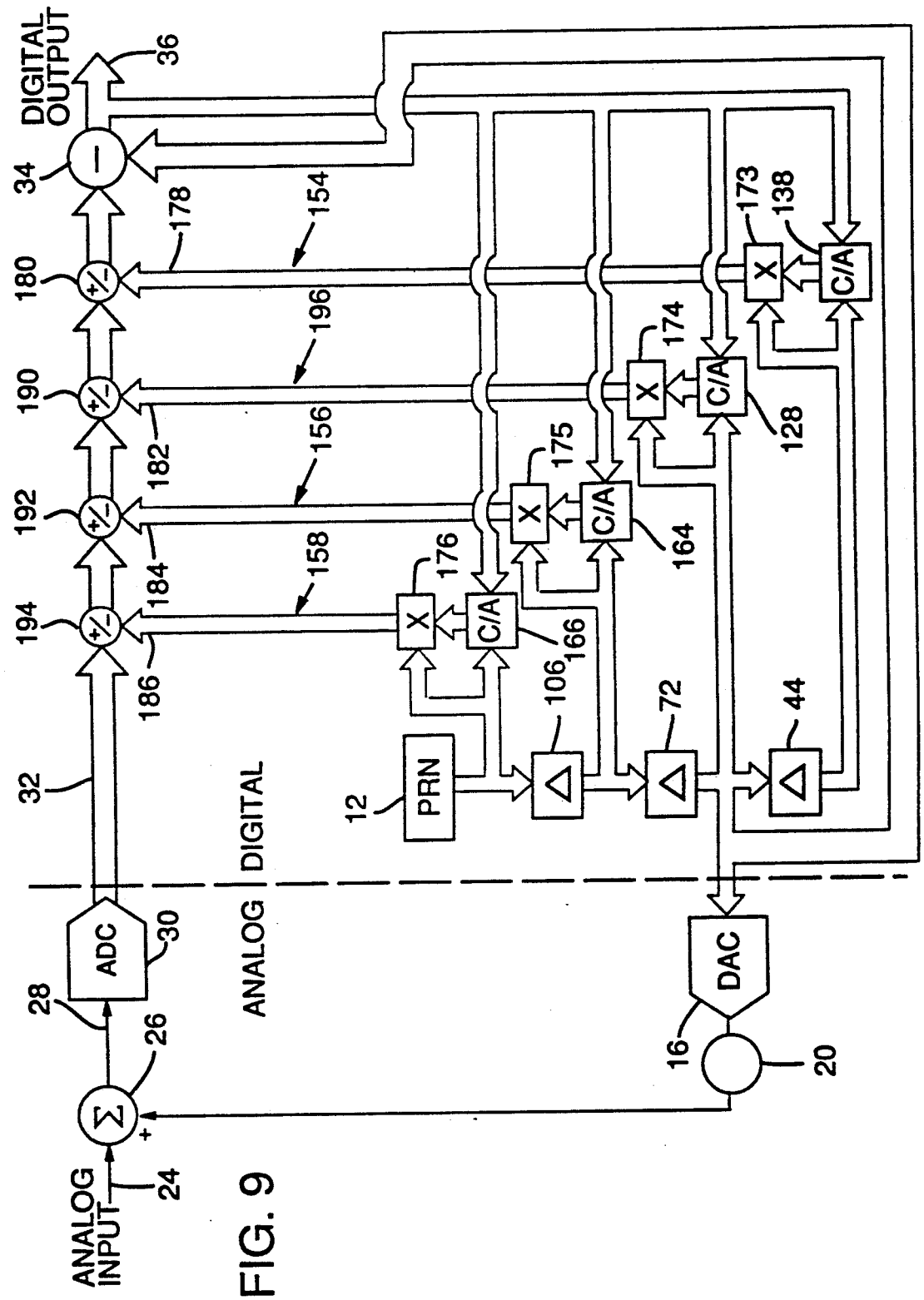
FIG. 9 is a block diagram of an all digital implementation of a generalized adaptive dithered ADC circuit according to the present invention.

In accordance with a seventh embodiment of the invention, the generalized, adaptive dithered ADC circuit of FIG. 8 may be further modified such that the error correction circuitry is entirely digitally implemented. Accordingly, the error correction signals are digitally generated and subtracted from the dither path after the ADC conversion. Referring to FIG. 9, by digitally implementating the error correction circuitry in a seventh embodiment, much of the analog circuitry can be eliminated. Thus, the DACs 46, 74, 108, 130, 142, 168, and 170, which are necessary in the sixth embodiment to produce analog error correction and feedback signals, are not included in the seventh embodiment. Instead, the error correction signals are generated by four digital multipliers 173, 174, 175 and 176. More particularly, in place of the DAC 46, the amplifier 62, and the feedback DAC 142 which provided an adaptive settling error correction signal 42 in the sixth embodiment, the multiplier 173 in the seventh embodiment generates an equivalent digital settling error correction signal 178. The multiplier 173 serves to scale the magnitude of the settling error correction path 154 according to the amount of correlation detected by the correlator/accumulator 138, thus performing a function similar to that to the amplifier 62. The digital settling error correction signal 178 is subtracted from the output of the ADC 30 by a digital subtractor 180.

Similarly, the digital multipliers 174, 175 and 176 generate digital error correction signals 182, 184, and 186 which are subtracted from the output of the ADC 30 by subtractors 190, 192, and 194, respectively. The digital multipliers 175 and 176 operate to scale the magnitudes of the feedthru error correction path 156 and the third order error correction path 158. The digital multiplier 174, the correlator/accumulator block 128, and the subtractor 190 operate as a correction path 196 for correcting dither gain error. Since the subtraction of the digital error correction signals 178, 182, 184, and 186 occurs before the subtraction Of the dither signal at the subtractor 34 (the "sense" point of the correlator/accumulator blocks is after the subtractor 34), the circuit acts as a multiple-tap negative feedback system.

Figure 10:
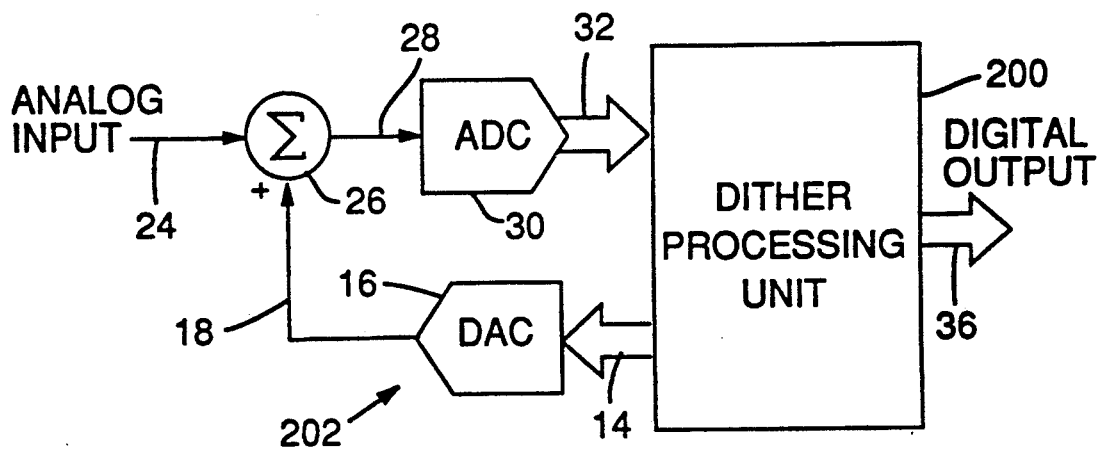
FIG. 10 is a block diagram of the circuit of FIG. 9 wherein the digital components are implemented in a single integrated circuit, or dither processing unit.

One advantage of the digital implementation of the seventh embodiment is the elimination of the multiple DACs associated with the analog correction signal paths and feedback paths. An additional advantage of an all digital implementation is that the digital error correction circuitry (the right half o FIG. 9) may be incorporated into a single monolithic integrated circuit or dither processing unit. Such a dither processing unit 200 is connected in a dithered ADC circuit 202 as shown in FIG. 10. The dither processing unit 200 includes both the circuitry for the generation of the dither signal and the circuitry for dither error correction. With the dither processing unit, it is possible to construct dithered ADC circuits utilizing various pairings of ADCs and DACs of different types, e.g. differing in speed and number of bits. The dither processing unit is capable of overcoming many of the inherent imperfections of the ADC 30 and DAC 16 by correcting for the feedthru, settling and other higher order errors caused by isolation, settling time, and other limitations of these components.

Having described and illustrated the principles of our invention with reference to seven illustrative embodiments, it will be recognized that the invention can be modified in arrangement and detail without departing from such principles. For example, the invention can be realized as an "open"-loop error correction system wherein the error correction signals are subtracted from the digital output signal after subtraction of the dither signal from the digital output signal, instead of the "closed"-loop negative feedback system described herein. In view of the many possible embodiments to which the principles of our invention may be put, it should be recognized that the embodiments described herein are illustrative only and should not be taken as limiting the scope of our invention. Rather, we claim as our invention all such embodiments as may come within the scope and spirit of the following claims and equivalents thereto.

We claim:

1. A dithered analog-to-digital conversion circuit with component limitation error correction, comprising:
   a PRN generator for digitally generating a sequence of dither values;
   a dither DAC connected to the PRN generator for sequentially converting the dither values to analog form to produce an analog dither signal;
   an input for receiving an analog input signal;
   at least one generating means coupled to the PRN generator, each generating means generating a correction signal;
   summing means for combining the analog input signal and the analog dither signal to produce a combined signal, and for subtracting each correction signal from a dither signal path;
   an analog-to-digital converter for converting the combined signal to digital form; and
   a digital dither subtractor coupled to an output of the analog-to-digital converter for subtracting the sequence of dither values from the combined signal to produce a digital output signal.

2. The dithered analog-to-digital circuit of claim 1, wherein each generating means comprises:
   a correction DAC for sequentially converting the dither values to analog form to produce said correction signal, the correction DAC converting a first dither value concurrently with the dither DAC converting a current dither value, the first dither value being offset a predetermined number of dither values from the current dither value in the sequence of dither values;
   a delay latch associated with the correction DAC for separating the first dither value from the sequence of dither values; and
   a scaling block coupled to an output of the correction DAC for multiplying the correction signal by a gain constant.

3. The dithered analog-to-digital circuit of claim 2, wherein the summing means comprises an analog summing node for adding the analog dither signal to the analog input signal to form the combined signal, and for subtracting each correction signal from the combined signal.

4. The dithered analog-to-digital circuit of claim 2 wherein the summing means for subtracting each correction signal from a dither signal path comprises at least one digital subtractor connected to the dither signal path after the digital dither subtractor.

5. The dithered analog-to-digital conversion circuit of claim 2, wherein each generating means comprises:
   a correlator connected to the digital dither subtractor for detecting correlation between the digital output signal and dither values converted by the correction DAC;
   an accumulator connected to the correlator for producing an accumulated value equal to the amount of correlation detected by the correlator; and
   a gain control DAC for converting the accumulated value to a gain control signal, the gain control DAC connected to said scaling block to feed-back the gain control signal to said scaling block and thereby adjust said gain constant.

6. The dithered analog-to-digital conversion circuit of claim 2 for correcting settling errors due to speed limitations of its components wherein the correction DAC of one of the at least one generating means is a settling DAC for converting a first dither value concurrently with the dither DAC converting a current dither value, the first dither value preceding the current dither value in the sequence of dither values.

7. The dithered analog-to-digital conversion circuit of claim 6 wherein the scaling block of said one of the generating means comprises a difference circuit for subtracting a signal proportional to the current dither value from the correction signal.

8. The dithered analog-to-digital conversion circuit of claim 1 for correcting settling errors due to speed limitations of its components wherein one of the at least one generating means comprises a settling DAC for, concurrently with the dither DAC converting a current dither value, converting to analog form a value proportional to the difference between a first dither value and the current dither value, the first dither value preceding the current dither value in the sequence of dither values.

9. The dithered analog-to-digital conversion circuit of claim 2 for correcting feedthru errors due to inadequate input to output isolation of its components wherein the correction DAC of one of the at least one generating means is a feedthru DAC for converting a first dither value concurrently with the dither DAC converting a current dither value, the first dither value following the current dither value in the sequence of dither values.

10. The dithered analog-to-digital conversion circuit of claim 1 wherein each of the generating means comprises:
a correlator connected to the digital dither subtractor for detecting correlation between the digital output signal and the dither values, the correlator detecting correlation between the digital output signal and a first dither value concurrently with the dither DAC converting a current dither value, the first dither value being offset a predetermined number of dither values from the current dither value in the sequence of dither values;
an accumulator connected to the correlator for accumulating an amount of correlation detected by the correlator; and
a multiplier connected to the accumulator for multiplying the first dither value by a scaling value proportional to the amount of correlation to produce said correction signal.

11. The dithered analog-to-digital circuit of claim 10, wherein the summing means comprises:
at least one digital subtractor coupled between the output of the analog-to-digital converter and the digital dither subtractor for subtracting each correction signal from the combined signal.

12. The dithered analog-to-digital circuit of claim 10, wherein the summing means comprises:

at least one digital subtractor connected to the dither signal path after the digital dither subtractor for subtracting each correction signal from the digital output signal, the at least one digital subtractor corresponding one-to-one with the at least one generating means.

13. The dithered analog-to-digital circuit of claim 10 wherein the PRN generator, the at least one generating means, the summing means for subtracting each correction signal from a dither signal path, and the digital dither subtractor are digitally implemented in a single integrated circuit.

14. A method of correcting residue errors in a dithered analog-to-digital conversion circuit, comprising:
generating a sequence of dither values with a digital PRN generator;
converting sequentially said dither values to analog form with a dither DAC to form an analog dither signal;
concurrently with the converting of each dither value in said sequence with the dither DAC, generating at least one correction signal, each correction signal proportional to a dither value offset a predetermined number of dither values in the sequence from the dither value currently converted by the dither DAC;
summing the analog dither signal with an analog input signal to form a combined signal;
converting the combined signal to digital form using an analog-to-digital converter;
subtracting the at least one correction signal from a dither signal path; and
subtracting the sequence of dither values from the combined signal to form an output signal.

15. The method of claim 14 for also dynamically adjusting the correction signals, comprising for each correction signal;
detecting an amount of correlation between the output signal and said dither value offset a predetermined number of dither values in the sequence from the dither value currently converted by the dither DAC;
accumulating the amount of correlation;
scaling the correction signal by an adjustable gain value; and
adjusting said gain value according to the amount of correlation.

* * * * *